(12) United States Patent
Bednorz et al.

(10) Patent No.: US 7,376,006 B2
(45) Date of Patent: May 20, 2008

(54) ENHANCED PROGRAMMING PERFORMANCE IN A NONVOLATILE MEMORY DEVICE HAVING A BIPOLAR PROGRAMMABLE STORAGE ELEMENT

(75) Inventors: Johannes Georg Bednorz, Wolfhausen (CH); John Kenneth DeBrosse, Colchester, VT (US); Chung Hon Lam, Peekskill, NY (US); Gerhard Ingmar Meijer, Zurich (CH); Jonathan Zanhong Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 11/216,518

(22) Filed: Aug. 31, 2005

(65) Prior Publication Data

US 2006/0256611 A1  Nov. 16, 2006

Related U.S. Application Data

(60) Provisional application No. 60/680,563, filed on May 13, 2005.

(51) Int. Cl.
*G11C 11/00* (2006.01)
*G11C 11/14* (2006.01)

(52) U.S. Cl. .................. 365/158; 365/171; 365/173
(58) Field of Classification Search ............... 365/158, 365/171, 173
See application file for complete search history.

(56) References Cited

U.S. PATENT DOCUMENTS 6,204,139 B1   3/2001  Liu et al.
6,714,444 B2   3/2004  Huai et al.
6,757,187 B2*  6/2004  Hoenigschmid ............ 365/158
6,826,076 B2* 11/2004  Asano et al. ............... 365/158
6,829,161 B2  12/2004  Huai et al.
6,838,740 B2   1/2005  Huai et al.
6,847,547 B2   1/2005  Albert et al.
6,888,742 B1   5/2005  Nguyen et al.
6,914,808 B2*  7/2005  Inaba ......................... 365/158
6,958,502 B2* 10/2005  Lu .............................. 365/158
7,085,174 B2*  8/2006  Hidaka ....................... 365/158
2004/0130936 A1  7/2004  Nguyen et al.
2006/0013039 A1*  1/2006  Braun et al.

FOREIGN PATENT DOCUMENTS

WO    WO 00/49659 A1    8/2000

* cited by examiner

*Primary Examiner*—Trong Phan
(74) *Attorney, Agent, or Firm*—Ido Tuchman; Ryan, Mason & Lewis, LLP

(57) ABSTRACT

A nonvolatile memory cell includes a bipolar programmable storage element operative to store a logic state of the memory cell, and a metal-oxide-semiconductor device including first and second source/drains and a gate. A first terminal of the bipolar programmable storage element is adapted for connection to a first bit line. The first source/drain is connected to a second terminal of the bipolar programmable storage element, the second source/drain is adapted for connection to a second bit line, and the gate is adapted for connection to a word line.

12 Claims, 6 Drawing Sheets

ENHANCED PROGRAMMING PERFORMANCE IN A NONVOLATILE MEMORY DEVICE HAVING A BIPOLAR PROGRAMMABLE STORAGE ELEMENT

CROSS-REFERENCE TO RELATED APPLICATION(S)

This application claims the benefit of U.S. Provisional Application Ser. No. 60/680,563, filed May 13, 2005, the disclosure of which is incorporated by reference herein.

FIELD OF THE INVENTION

The present invention relates generally to memory devices, and more particularly relates to enhancing a programming performance of a nonvolatile memory device having a bipolar programmable storage element.

BACKGROUND OF THE INVENTION

Bipolar programmable storage elements offer a potential replacement for current non-volatile memory, including, but not limited to, flash memory, one-transistor one-capacitor (1T1C) dynamic random access memory (DRAM) and static random access memory (SRAM). Memory devices employing bipolar programmable storage elements typically rely on a reversal of the polarity of a voltage applied across the storage element in each of the devices in order to write the respective logic states of the memory devices. These nonvolatile bipolar programmable storage elements, which include materials such as "spin-switched" or "spin momentum transfer" magnetic materials and/or programmable resistance transition-metal oxides, can be programmed at low voltages (e.g., less than about 1.5 volts) and can achieve a high performance comparable to DRAM or SRAM and superior to flash memory.

Due to the bipolar nature of the programmable storage element, in a one-transistor one programmable element (1T1PE) memory cell configuration, each memory cell will typically require an intervening erase operation, which involves the use of negative voltages, before a write operation is performed. This intervening erase operation undesirably increases the complexity of circuits that are peripheral to the memory device in order to support the generation of the negative voltages employed, and is therefore an impediment to achieving higher performance in the memory device. Although, a direct write without the intervening erase operation can be achieved by providing dual select lines in a bit direction, this approach would significantly increase a size of the memory cell in order to accommodate the additional select lines. Consequently, the cost of the memory cell, which is directly proportional to memory cell size, would increase accordingly. Thus, it is of utmost importance to minimize the size and complexity of the memory cell.

There exists a need, therefore, for a nonvolatile memory device including a bipolar programmable storage element that does not suffer from one or more of the problems exhibited by conventional memory devices having bipolar programmable storage elements.

SUMMARY OF THE INVENTION

The present invention meets the above-noted need by providing, in an illustrative embodiment, a nonvolatile memory device including a bipolar programmable storage element which is configured so as to eliminate the necessity of an intervening erase operation, without increasing a complexity of peripheral support circuits associated with the memory device. The memory device may be fabricated in a manner which minimizes a footprint of the device, so as to achieve an efficient memory array layout.

In accordance with one aspect of the invention, a nonvolatile memory cell includes a bipolar programmable storage element operative to store a logic state of the memory cell, and a metal-oxide-semiconductor device including first and second source/drains and a gate. A first terminal of the bipolar programmable storage element connects to a first bit line. The first source/drain is connected to a second terminal of the bipolar programmable storage element, the second source/drain connects to a second bit line, and the gate connects to a word line.

In accordance with another aspect of the invention, a nonvolatile memory array includes a plurality of bit lines and word lines, and a plurality of nonvolatile memory cells operatively coupled to the bit lines and word lines for selectively accessing one or more memory cells in the memory array. At least one of the memory cells includes a bipolar programmable storage element operative to store a logic state of the memory cell, a first terminal of the bipolar programmable storage element connecting to a first corresponding one of the bit lines; and a metal-oxide-semiconductor device including first and second source/drains and a gate, the first source/drain being connected to a second terminal of the bipolar programmable storage element, the second source/drain connecting to a second corresponding one of the bit lines, and the gate connecting to a corresponding one of the word lines.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative nonvolatile memory cell and memory array employing a plurality of nonvolatile memory cells. It should be understood, however, that the present invention is not limited to these or any other particular circuit arrangements. Rather, the invention is more generally applicable to techniques for enhancing a programming performance of a nonvolatile memory device having a bipolar programmable storage element. Although implementations of the present invention are described herein with specific reference to a metal-oxide-semiconductor (MOS) field-effect transistor (FET) device, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1A:
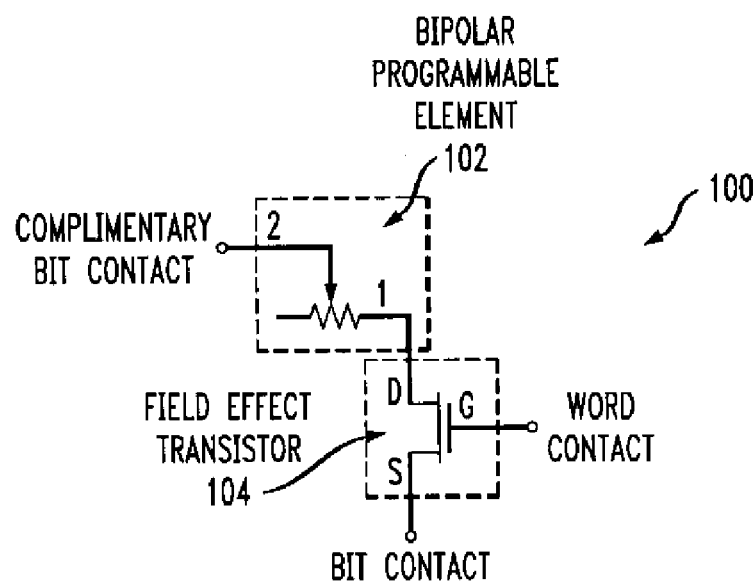
FIG. 1A is a schematic diagram depicting an exemplary nonvolatile memory device including a bipolar programmable storage element, formed in accordance with one embodiment of the present invention.

FIG. 1A is a schematic diagram depicting an exemplary nonvolatile memory cell 100 in which the techniques of the present may be implemented. The illustrative memory cell 100 includes a two-terminal bipolar programmable storage element 102 connected in series with a FET device 104 having a gate (G), a source (S) and a drain (D). Specifically, a first terminal (1) of the programmable storage element 102 is connected to the drain of the FET device 104. The source of the FET device 104 preferably forms a bit contact of the memory cell 100 and a second terminal (2) of the programmable storage element 102 forms a complementary bit contact of the memory cell. The term "contact" as used herein is intended to refer to essentially any means for providing electrical connection to a device, node, junction of two or more conductors and/or semiconductors, etc., and may include terminals, pins, etc., as will be known by those skilled in the art. The gate of the FET device 104 forms a word contact, which functions as a select gate of the memory cell 100. The word contact may be coupled to a corresponding word line in a memory array (not shown) employing a plurality of such memory cells. Likewise, the bit contacts may be coupled to corresponding bit lines in the memory array. While preferably running in the same direction, the two bit lines for a given memory cell may exist in different metal levels (e.g., metal 1 and metal 2) in order to reduce the size of the memory cell 100.

It is to be appreciated that, because an MOS device is symmetrical in nature, and thus bi-directional, the assignment of source and drain designations in the MOS device is essentially arbitrary. Therefore, the source and drain may be referred to herein generally as first and second source/drain, respectively, where "source/drain" in this context denotes a source or a drain. Likewise, the designations of the bit contact and complementary bit contact may be reversed, with essentially no effect on the operation of the memory cell 100.

The bipolar programmable storage element 102 is represented in the figure by a programmable resistor having a variable resistance element associated therewith. The resistance of the programmable storage element 102 can be programmed into one of at least two distinct resistances in a write operation of the memory cell 100. Examples of bipolar programmable storage elements include, but are not limited to, materials such as "spin-switched" or "spin momentum transfer" magnetic materials and programmable resistance transition-metal oxides, as previously stated.

In a "spin-switched" or "spin momentum transfer" memory device, a logic state of a magnetic tunnel junction (MTJ) in the device is switched or written by passing current through the MTJ. A standard MTJ comprises a storage (free) layer and a reference layer separated by a tunnel barrier. A magnetization of the storage layer may be oriented parallel or anti-parallel to the reference layer, representing either a logic "0" or a "1." When writing the MTJ, tunneling carriers in the MTJ exert a "magnetic torque" upon the storage layer, causing it to switch. The polarity of a write current used to write the MTJ primarily determines the state written into the MTJ. Similarly, when reading the logic state of the MTJ, a read current is passed through the MTJ to determine its effective resistance, and thereby determine its corresponding state. The write current must be sufficiently larger than the read current such that the read current does not unintentionally disturb the state of the cell.

Figure 2:
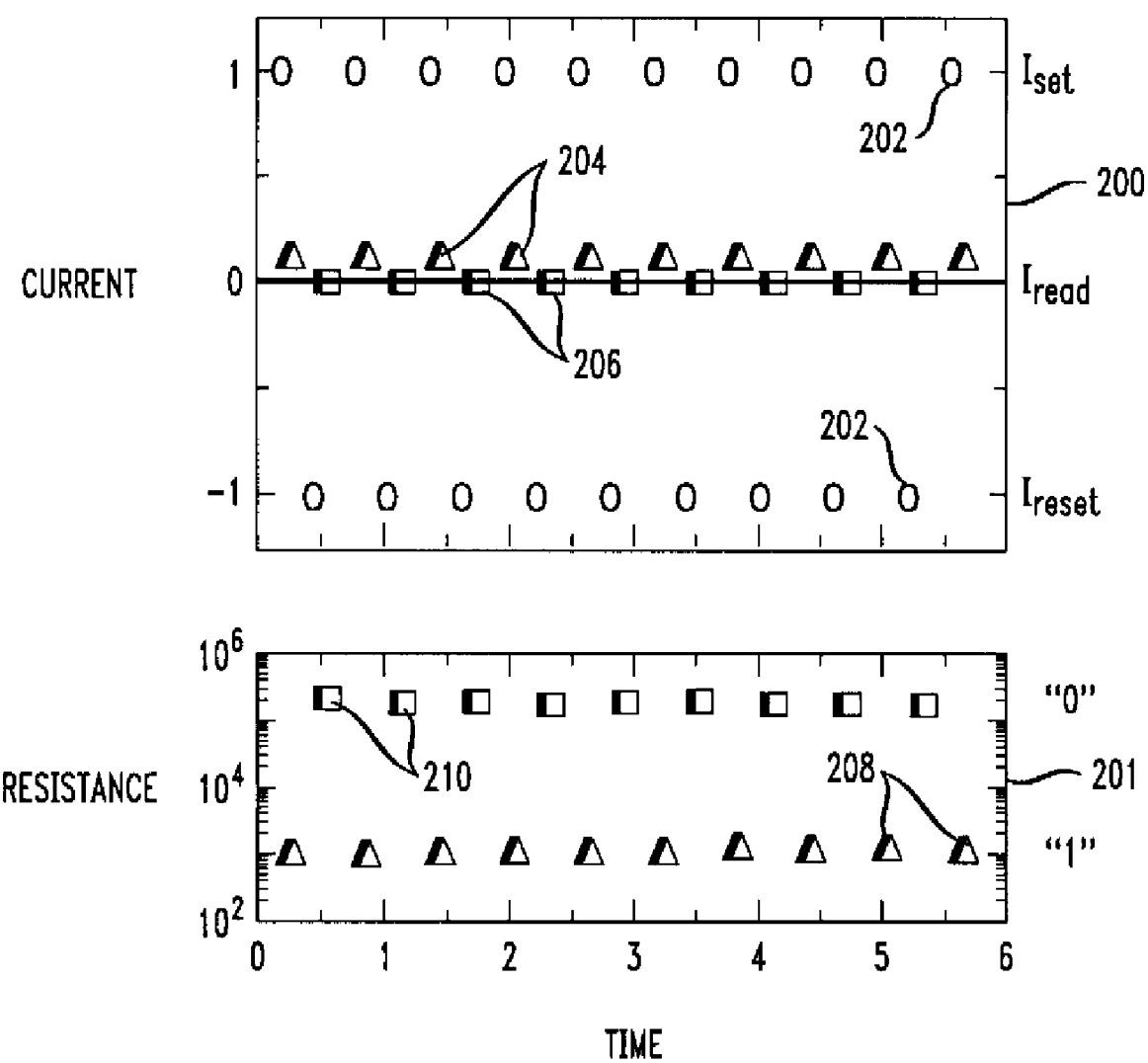
FIG. 2 is a graphical illustration depicting exemplary bipolar programmable resistance characteristics of a transition-metal oxide storage element.

In a bipolar programmable memory cell comprising a transition-metal oxide (TMO) material as the storage element, a logic state of the TMO storage element is programmed or written by passing a current, $I_{set}$ or $I_{reset}$, through the TMO storage element. This is illustrated in FIG. 2, which depicts an exemplary bipolar programmable resistance of a TMO material (graph 201) and corresponding programming/read current (graph 200). The current $I_{set}$, which is shown as having a magnitude of 1 arbitrary unit and a positive sign, may be used to write a logic "1" into the TMO storage element. Likewise, the current $I_{reset}$, which is shown as having a magnitude of 1 arbitrary unit and a negative sign, may be used to write a logic "0" into the TMO storage element. A read current, $I_{read}$, may be used to read the logic state of the TMO storage element. In graph 200, circles 202 represent programming current, triangles 204 represent a read current for a logic "1" state, and squares 206 represent a read current for a logic "0" state. In graph 201, triangles 208 represent a resistance of the TMO storage element while in a logic "1" state, and squares 210 represent the resistance of the TMO storage element while in a logic "0" state.

For programming, a bias voltage (e.g., about 1.5 volts) is preferably applied to the TMO storage element for a duration longer than a given time (e.g., about 100 nanoseconds (ns)). A polarity of the bias voltage used to write the TMO storage element primarily determines the logic state written into the memory cell. The resistance of the storage element can be varied, for example, from about one hundred kilo (k) ohms ($\Omega$) to about one k$\Omega$, representing a logic "0" and a logic "1", respectively, as shown in FIG. 2. Similarly, when reading the logic state of the TMO storage element, a read current (e.g., $I_{read}$) is passed through the TMO storage element to determine its effective resistance, and thereby determine its corresponding state. The read current should be sufficiently smaller than the write current, such that the read current does not unintentionally disturb the state of the memory cell. As shown in FIG. 2, the current for reading a logic "0" will be slightly smaller compared to the current for reading a logic "1," due primarily to the difference in resistance of the TMO storage element in the two logic states.

A TMO material suitable for use as bipolar programmable storage element 102 in the present invention includes, but is not limited to, chromium-doped strontium titanium oxide (Cr-doped $SrTiO_3$). Further suitable results have been achieved, in particular, with strontium zirconium oxide ($SrZrO_3$), praseodymium and/or calcium manganese oxide ((Pr,Ca)MnO$_3$), and other transition-metal oxides with perovskite or perovskite-like structures, each material being doped preferentially with chromium, manganese, or vanadium. Further, the materials described in International Application Publication No. WO 00/49659 A1 and U.S. Pat. No. 6,204,139 issued to Liu et al. on Mar. 20, 2001, incorporated herein by reference, are advantageously usable as storage element 102.

Thus, in an illustrative embodiment, a resistance state of the bipolar programmable storage element (which may comprise, for example, "spin-switched" or "spin momentum transfer" magnetic materials and/or programmable resistance transition-metal oxides), may be programmed by applying one or more electrical pulses across the first and second terminals of the storage element, the electrical pulses having a voltage potential which is greater than a threshold voltage, Vt, of the storage element and a duration which is greater than a time, t. Likewise, a resistance state of such a bipolar programmable storage element may be read in a non-destructive manner by applying one or more electrical pulses across the first and second terminals of the storage element and measuring a current through the storage element, the electrical pulses having a voltage potential which is less than a threshold voltage, Vt, of the storage element and/or a duration which is less than a time, t.

During a write cycle, a word line coupled to the word contact of the memory cell 100 is preferably driven high, turning on the FET 104. Depending on the logic state to be written, one bit line coupled to a bit contact of the cell is preferably driven to a logic high potential (e.g., 1 volt) and another bit line coupled to the other bit contact of the cell, being complementary, is driven to a logic low potential (e.g., 0 volt), thereby causing a current to flow through the bipolar programmable storage element 102 from the high bit line to the low bit line. When writing the state which requires current to flow from the FET 104 to the storage element 102, an overdrive (e.g., Vgs–Vt, where Vgs is a gate-to-source voltage of the FET and Vt is a threshold voltage of the FET) will be reduced, thus limiting the current. Boosting the selected word line to a voltage potential above a positive voltage supply, Vdd, of the memory cell, as is often done in a DRAM environment, can provide additional current to help alleviate this problem. During a read cycle, the word line is driven to a logic high potential (e.g., 1 volt), turning on the FET 104. Concurrently, one bit line, preferably the bit line connecting to the FET 104, is held at ground potential (logic low) while the other bit line is forced to a desired read voltage potential. The current on this second bit line is then sensed to determine the state of the memory cell 100.

In an alternative embodiment, which may be beneficial when the required write voltage and current are sufficiently small, one of the two bit lines connecting to the two bit contacts of a given memory cell can be replaced by a new connection to a mid-level voltage source. In this instance, during a write cycle, the remaining bit line is forced high or low depending on the state to be written. During a read cycle, the new connection is forced to the mid-level voltage plus or minus the desired read voltage. As before, the word line is driven high in both the read and write cycles. This alternative embodiment has the potential of achieving a smaller memory cell size due to the elimination of the second bit line.

Various design considerations may go into the selection of which bit line to eliminate (e.g., the bit line connected to the FET 104, or the bit line connected to the bipolar programmable element 102) and the choice of reading the cell at the mid-level voltage plus the read voltage (Vmid+Vread) or reading at the mid-level voltage minus the read voltage (Vmid–Vread). Moreover, the ideal choice for the mid-level voltage may not necessarily be Vdd/2, in order to compensate for other asymmetries which may exist in the memory cell 100.

Figure 1B:
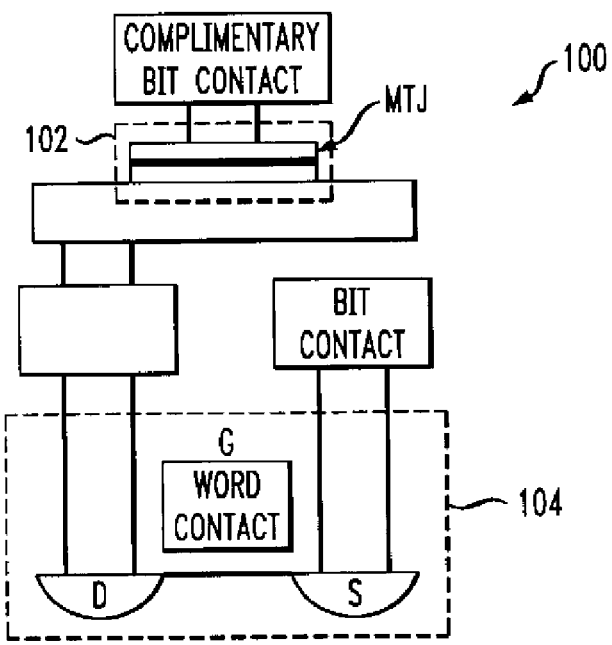
FIG. 1B is a cross-sectional view illustrating an exemplary semiconductor layout of the memory device shown in FIG. 1A, in accordance with the present invention.

FIG. 1B is a cross-sectional view depicting an exemplary semiconductor layout of at least a portion of the memory cell 100 shown in FIG. 1A. As apparent from the figure, the bipolar programmable storage element 102 preferably comprises an MTJ and/or programmable resistance TMO that is formed substantially directly above the FET device 104, so as to minimize the semiconductor area (footprint) consumed by the memory cell 100. It is to be understood that the present invention is not limited to the specific semiconductor layout shown.

Figure 3A:
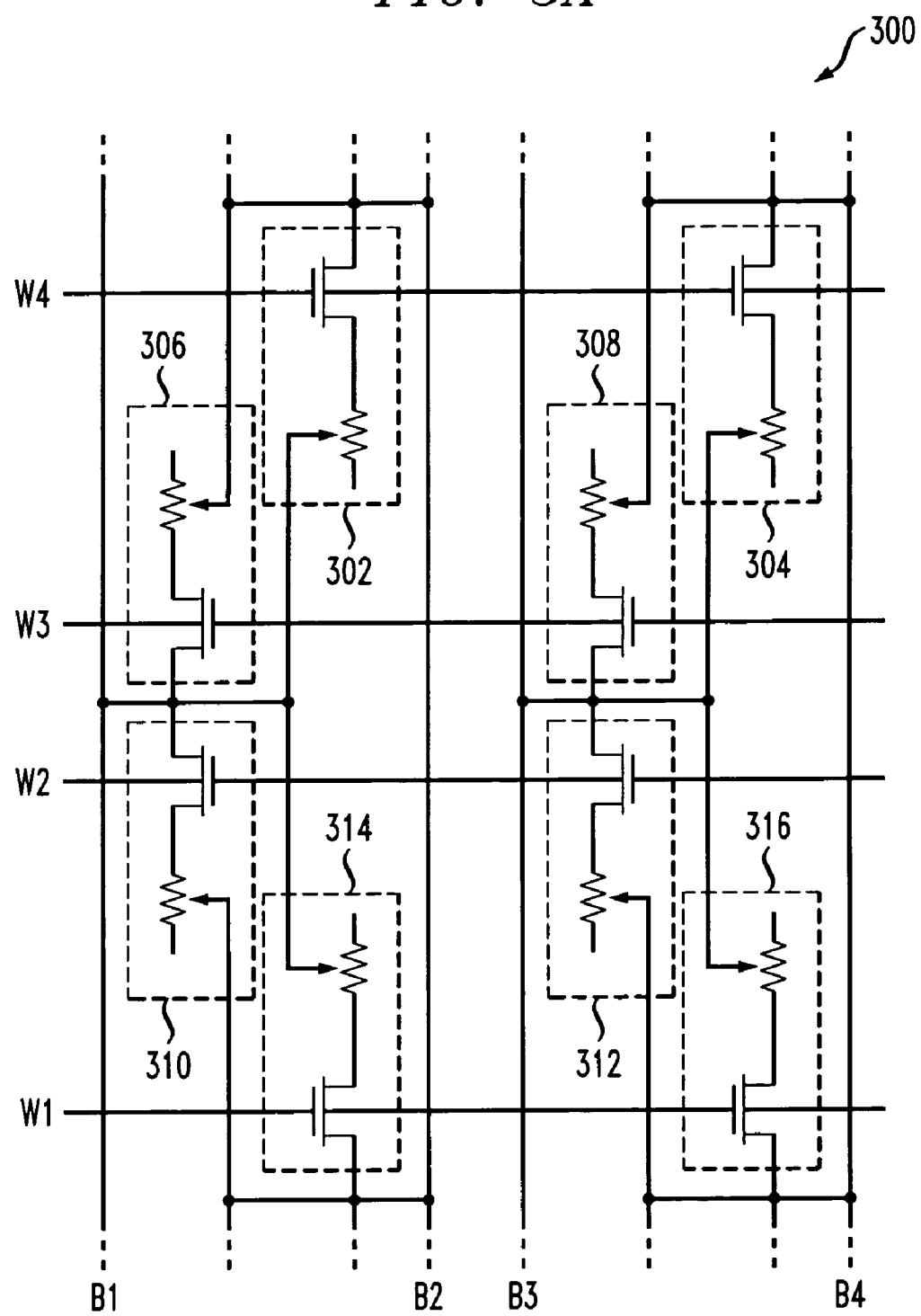
FIG. 3A is a schematic diagram depicting an exemplary memory array architecture including a plurality of the memory devices shown in FIG. 1A, in accordance with another embodiment of the present invention.

In a memory array comprising a plurality of memory cells, the word contacts of the respective memory cells are preferably connected to corresponding word lines in the memory array, and the respective bit and complementary bit contacts are preferably connected to corresponding bit lines in the memory array. FIG. 3A is a schematic diagram depicting at least a portion of an exemplary nonvolatile memory array 300, formed in accordance with one embodiment of the invention. The memory array 300 preferably employs a unique shared bit line architecture, which will be described in further detail below. The memory array 300 includes a plurality of memory cells 302, 304, 306, 308, 310, 312, 314 and 316, operatively coupled to corresponding word lines W1, W2, W3 and W4, and corresponding bit lines B1, B2, B3 and B4. In this embodiment, the word lines are arranged substantially parallel relative to one another, and the bit lines are arranged substantially parallel relative to one another. Furthermore, the words lines are preferably oriented substantially orthogonal to the bit lines. The present invention, however, is not limited to the particular word and bit line arrangement shown.

Figure 3B:
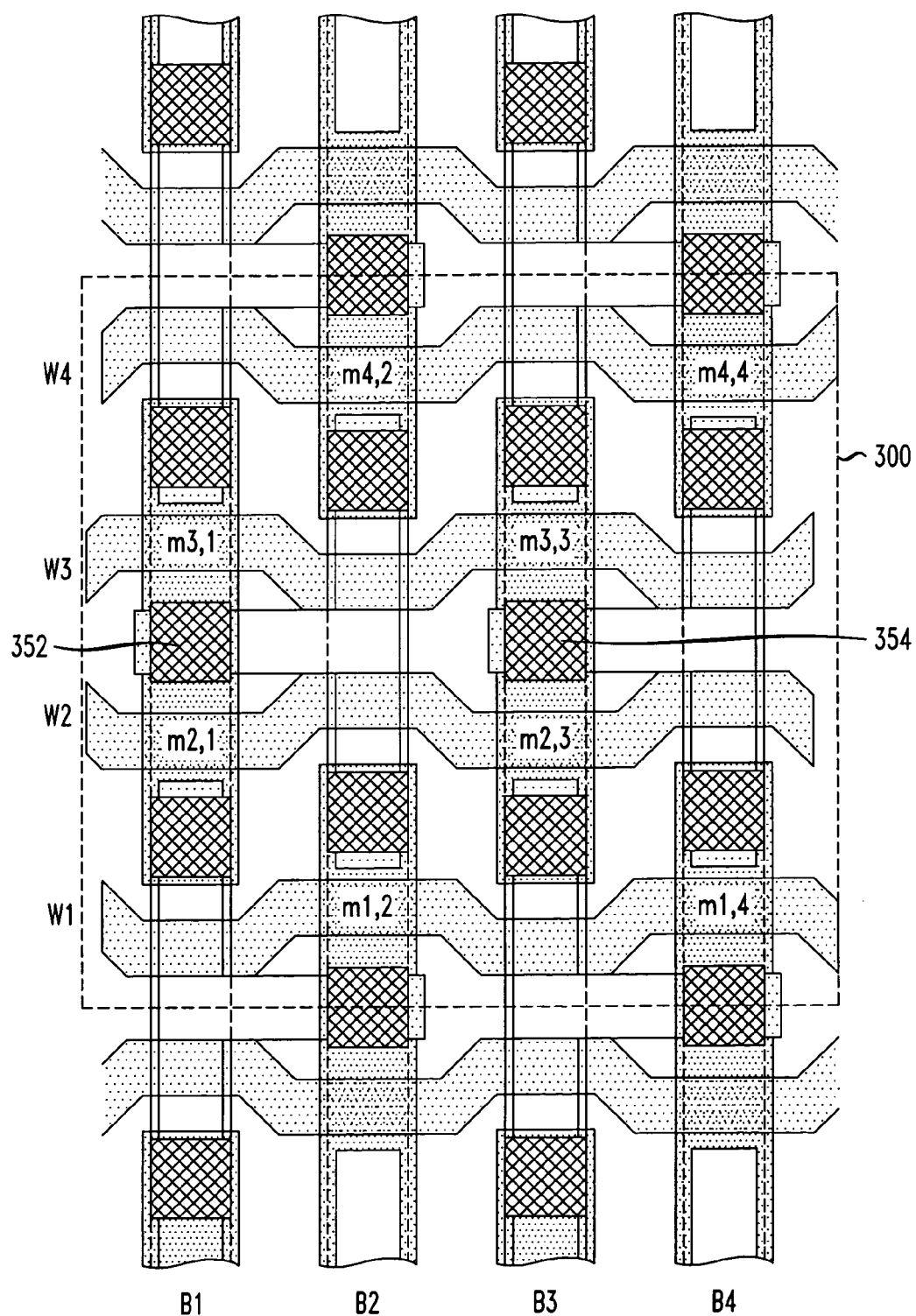
FIG. 3B is a top plan view illustrating an exemplary semiconductor layout of the memory array architecture shown in FIG. 3A, in accordance with the present invention.

FIG. 3B is a top plan view depicting an exemplary semiconductor layout 350 of the memory array 300 shown in FIG. 3A, in accordance with the present invention. As apparent from the figure, the layout 350 of the memory array 300 can be arranged to provide a substantially minimized memory cell footprint, compared to conventional memory arrays employing nonvolatile memory cell having a bipolar programmable storage element. The footprint of the resulting bipolar programmable memory cell is similar to that of a DRAM cell array having a folded bit line architecture. In the layout of FIG. 3B, the designations mi,j is used to represent a memory cell corresponding to word line Wi and bit line Bj. For example, memory cell m1,2 in FIG. 3B corresponds to memory cell 314 in FIG. 3A. Likewise, m2,1 corresponds to memory cell 310, m3,1 corresponds to memory cell 306, m4,2 corresponds to memory cell 302, m3,3 corresponds to memory cell 308, m2,3 corresponds to memory cell 312, m4,4 corresponds to memory cell 304, and m1,4 corresponds to memory cell 316.

With reference to FIGS. 3A and 3B, the bit lines B1 through B4 are preferably laid out in pairs. Two pairs of bit lines are illustrated in FIG. 3A, where B1 is paired with B2, and B3 is paired with B4. In the exemplary memory array 300, each of the bit line contacts, which are connection points between a bit line and a corresponding memory cell, are shared by two bit contacts and two complimentary bit contacts from four individual memory cells. For example, the bit contacts of memory cells m2,1 and m3,1, along with the complimentary bit contacts of memory cells m1,2 and m4,2, are shared on bit line contact 352 on bit line B1. Likewise, the bit contacts of memory cells m3,3 and m2,3, along with the complimentary bit contacts of memory cells m4,4 and m1,4, are shared on bit line contact 354 on bit line B3. In this arrangement, only one memory cell is selected with one active word line and a pair of bit lines functioning as true and complementary bit lines, similar to an SRAM.

In a preferred embodiment, at least a subset of the memory cells are arranged such that a first one of the bit lines is connected to the first terminals of the bipolar programmable storage elements in a first and second one of the memory cells and connected to the second source/drains of the metal-oxide-semiconductor devices in a third and fourth one of the memory cells, and a second one of the bit lines is connected to the first terminals of the bipolar programmable storage elements in the third and fourth one of the memory cells, and the second source/drains of the metal-oxide-semiconductor devices in the first and second one of the memory cells, and wherein the gates of the first, second third and fourth one of the memory cells are connected to different word lines in the memory array.

Figure 4:
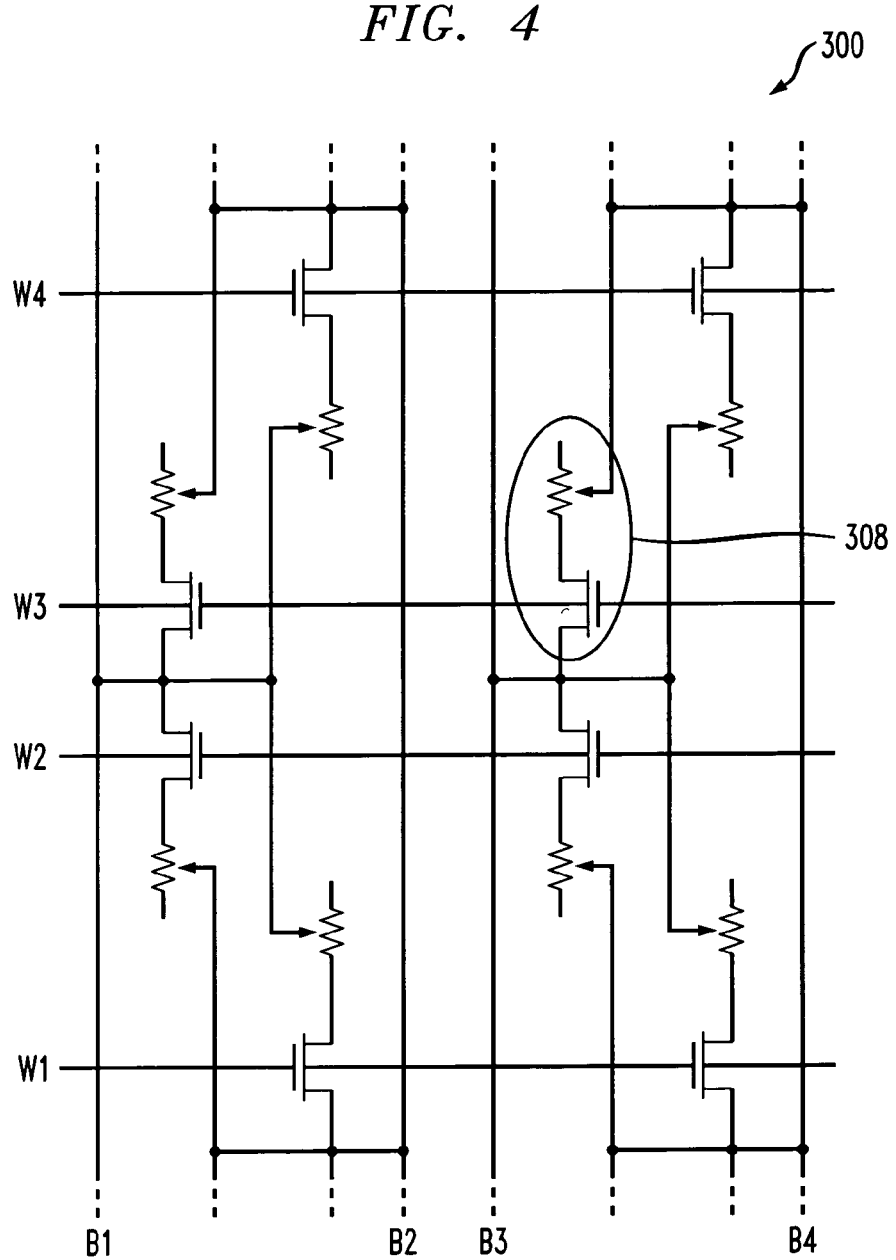
FIG. 4 is a schematic diagram depicting the memory array shown in FIG. 3A with accompanying exemplary bias voltages applied to the word and bit lines for reading a selected one of the memory cells, in accordance with the present invention.

FIG. 4 is a schematic diagram depicting the memory array shown in FIG. 3A with accompanying exemplary bias voltages applied to the word and bit lines for reading a selected one of the memory cells. As apparent from the figure, memory cell m3,3, corresponding to memory cell 308 in memory array 300, is selected by concurrently activating word line W3 and bit line B3. Exemplary bias voltages applied to each of the bit lines (e.g., B1-B4) and word lines (W1-W4) depicted in the figure are shown in the accompanying bias table 400. The "x" entries in table 400 indicate that there is no memory cell in the memory array that corresponds to that particular word line and bit line pair.

For reading selected memory cell 308, a small read voltage, such as about 0.5 volt (V) or less, is applied to the active bit line B3 and the complementary bit line B4 corresponding to the selected cell is held at 0V. Concurrently, the word line W3 is biased at about 1V in this example. The remaining bit lines, namely, B1 and B2, as well as the remaining word lines, namely, W1, W2 and W4, not corresponding to the selected memory cell 308, are preferably held at 0V. The resistance value, and thus the state of the stored bit, can be determined by sensing the magnitude of the current passing through the bipolar programmable storage element in the memory cell 308.

Memory cells associated with a word line that is held at 0V (unselected) cannot be read from or written to, since the FET devices in those respective memory cells will be turned off. Similarly, for memory cells sharing a common selected word line, W3 in this example, it is important that the pair of bit lines corresponding to an unselected memory cell are held at substantially the same voltage potential so as to prevent a current from flowing through the bipolar programmable storage element in that memory cell. In the illustrative scenario of FIG. 4, since word line W3 is active, unselected memory cell m3,1 may also be read. Accordingly, complementary bit lines B1 and B2 corresponding to memory cell m3,1 are held at the same potential, namely, 0V.

Figure 5:
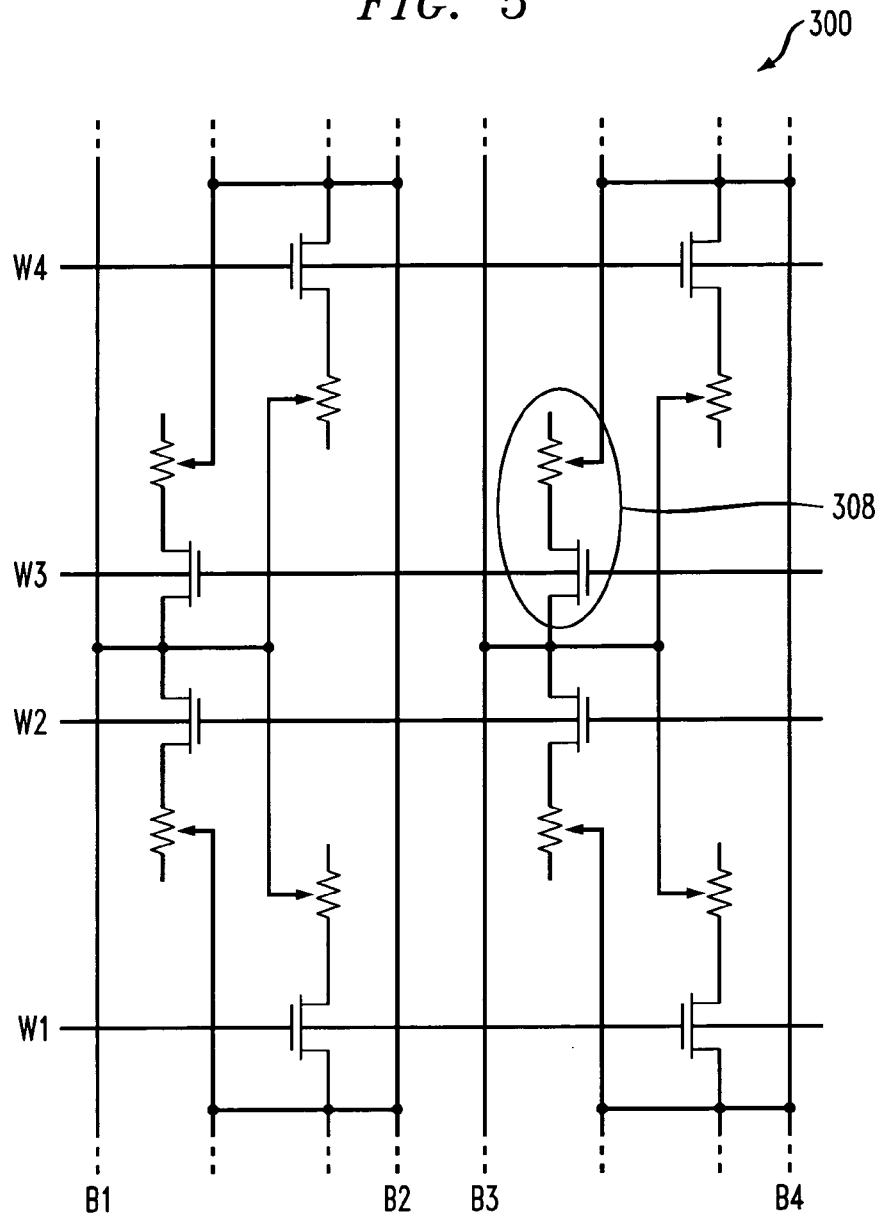
FIG. 5 is a schematic diagram depicting the memory array shown in FIG. 3A with accompanying exemplary bias voltages applied to the word and bit lines for writing a selected one of the memory cells, in accordance with the present invention.

FIG. 5 is a schematic diagram depicting the memory array 300 shown in FIG. 3A with accompanying exemplary bias voltages applied to the word and bit lines for writing a selected one of the memory cells. Exemplary bias voltages applied to each of the bit lines (e.g., B1-B4) and word lines (e.g., W1-W4) depicted in the figure are shown in the accompanying bias table 500. As apparent from the figure, memory cell m3,3, corresponding to memory cell 308 in memory array 300, is selected for to be programmed by activating word line W3. The remaining word lines, W1, W2 and W4, are all held at 0V, thereby turning off the FET devices in the respective memory cells m4,2, m4,4, m2,1, m2,3, m1,2 and m1,4. Depending on the value of the resistance, and thus the state, of the corresponding bipolar programmable storage element to be written, the paired bit lines, B3 and B4, is biased to opposite polarities. In this example, based on the current versus voltage characteristics shown in FIG. 2, 1V and 0V are used to bias the pair of complementary bit lines B3 and B4 associated with the selected memory cell 308. In order to increase the overdrive and thereby provide a higher programming current for a selected memory cell, the activated word line W3 can be biased to a potential greater than the positive supply, such as, for example, about 1.5V.

While the above description, with reference to FIGS. 4 and 5, documents an exemplary read and write operation of a selected memory cell 308 in a shared bit line memory array architecture 300, multiple-bit applications can be similarly exercised, in accordance with another aspect of the invention, for example, by varying the magnitudes of voltage potentials applied to the bit lines and word line during a write operation, and/or by using multiple sensing references during a read operation.

At least a portion of the nonvolatile memory cell and/or memory array of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:
1. A nonvolatile memory array, comprising:
a plurality of bit lines and word lines; and
a plurality of nonvolatile memory cells operatively coupled to the bit lines and word lines for selectively accessing one or more memory cells in the memory array, at least one of the memory cells comprising:
a bipolar programmable storage element operative to store a logic state of the memory cell, a first terminal of the bipolar programmable storage element connecting to a corresponding first one of the bit lines; and
a metal-oxide-semiconductor device including first and second source/drains and a gate, the first source/drain being connected to a second terminal of the bipolar programmable storage element, the second source/drain connecting to a corresponding second one of the bit lines, and the gate connecting to a corresponding one of the word lines;
wherein storing a logic state of the memory cell comprises applying an electrical current through the storage element; and
wherein a logic state of the bipolar programmable storage element is written by substantially concurrently applying a logic high voltage potential to the word line, applying a logic high voltage potential to one of the first and second bit lines, and applying a logic low voltage potential to another of the first and second bit lines, a polarity of a voltage potential across the first and second bit lines being indicative of the logic state to be written into the memory cell.

2. The memory array of claim 1, wherein at least a subset of the memory cells are arranged such that a first one of the bit lines is connected to the first terminals of the bipolar programmable storage elements in a first and second one of the memory cells and connected to the second source/drains of the metal-oxide-semiconductor devices in a third and fourth one of the memory cells, and a second one of the bit lines is connected to the first terminals of the bipolar programmable storage elements in the third and fourth one of the memory cells, and the second source/drains of the metal-oxide-semiconductor devices in the first and second one of the memory cells, and wherein the gates of the first, second third and fourth one of the memory cells are connected to different word lines in the memory array.

3. The memory array of claim 1, wherein the plurality of bit lines are arranged substantially parallel relative to one another.

4. The memory array of claim 1, wherein the plurality of word lines are arranged substantially parallel relative to one another.

5. The memory array of claim 1, wherein the bipolar programmable storage element comprises a magnetic tunnel junction device.

6. The memory array of claim 1, wherein the bipolar programmable storage element comprises a transition-metal oxide.

7. A nonvolatile memory array, comprising:
 a plurality of bit lines and word lines; and
 a plurality of nonvolatile memory cells operatively coupled to the bit lines and word lines for selectively accessing one or more memory cells in the memory array, at least one of the memory cells comprising:
 a bipolar programmable storage element operative to store a logic state of the memory cell, a first terminal of the bipolar programmable storage element connecting to a corresponding first one of the bit lines; and
 a metal-oxide-semiconductor device including first and second source/drains and a gate, the first source/drain being connected to a second terminal of the bipolar programmable storage element, the second source/drain connecting to a corresponding second one of the bit lines, and the gate connecting to a corresponding one of the word lines;
 wherein storing a logic state of the memory cell comprises applying an electrical current though the storage element; and
 wherein a logic state of the bipolar programmable storage element is read by substantially concurrently applying a logic high voltage potential to the word line, applying a logic low voltage potential to one of the first and second bit lines, applying a read voltage potential to and sensing a current on another of the first and second bit lines, a magnitude of the sensed current being indicative of the logic state of the memory cell.

8. The memory array of claim 7, wherein at least a subset of the memory cells are arranged such that a first one of the bit lines is connected to the first terminals of the bipolar programmable storage elements in a first and second one of the memory cells and connected to the second source/drains of the metal-oxide-semiconductor devices in a third and fourth one of the memory cells, and a second one of the bit lines is connected to the first terminals of the bipolar programmable storage elements in the third and fourth one of the memory cells, and the second source/drains of the metal-oxide-semiconductor devices in the first and second one of the memory cells, and wherein the gates of the first, second third and fourth one of the memory cells are connected to different word lines in the memory array.

9. The memory array of claim 7, wherein the plurality of bit lines are arranged substantially parallel relative to one another.

10. The memory array of claim 7, wherein the plurality of word lines are arranged substantially parallel relative to one another.

11. The memory array of claim 7, wherein the bipolar programmable storage element comprises a magnetic tunnel junction device.

12. The memory array of claim 7, wherein the bipolar programmable storage element comprises a transition-metal oxide.

* * * * *